US012812923B2

(12) United States Patent
Masuda et al.

(10) Patent No.: US 12,812,923 B2
(45) Date of Patent: Nov. 24, 2026

(54) SILICON CARBIDE SEMICONDUCTOR DEVICE HAVING AN ACTIVE REGION, A PERIPHERAL REGION, AND A FIRST ELECTRODE

(71) Applicants: MITSUMI ELECTRIC CO., LTD., Tokyo (JP); NATIONAL INSTITUTE OF ADVANCED INDUSTRIAL SCIENCE AND TECHNOLOGY, Tokyo (JP)

(72) Inventors: Takeyoshi Masuda, Osaka (JP); Ryouji Kosugi, Tsukuba (JP)

(73) Assignees: MITSUMI ELECTRIC CO., LTD., Tokyo (JP); NATIONAL INSTITUTE OF ADVANCED INDUSTRIAL SCIENCE AND TECHOLOGY, Tokyo (JP)

( * ) Notice: Subject to any disclaimer, the term of this patent is extended or adjusted under 35 U.S.C. 154(b) by 498 days.

(21) Appl. No.: 18/013,456

(22) PCT Filed: Mar. 11, 2021

(86) PCT No.: PCT/JP2021/009766

§ 371 (c)(1),
(2) Date: Dec. 28, 2022

(87) PCT Pub. No.: WO2022/009474

PCT Pub. Date: Jan. 13, 2022

(65) Prior Publication Data

US 2023/0282695 A1 Sep. 7, 2023

(30) Foreign Application Priority Data

Jul. 10, 2020 (JP) ................................ 2020-118900

(51) Int. Cl.
*H10D 62/10* (2025.01)
*H10D 30/63* (2025.01)
(Continued)

(52) U.S. Cl.
CPC ........... *H10D 62/111* (2025.01); *H10D 30/63* (2025.01); *H10D 62/60* (2025.01); *H10D 62/8325* (2025.01); *H10D 64/513* (2025.01)

(58) Field of Classification Search
CPC ...... H10D 62/111; H10D 30/63; H10D 62/60; H10D 62/8325; H10D 64/513; H10D 8/00;
(Continued)

(56) References Cited

U.S. PATENT DOCUMENTS

| | | | | |
|---|---|---|---|---|
| 2003/0222327 A1* | 12/2003 | Yamaguchi | .......... | H10D 64/111 257/500 |
| 2005/0280086 A1* | 12/2005 | Saito | .................... | H10D 30/665 257/341 |

(Continued)

FOREIGN PATENT DOCUMENTS

| | | |
|---|---|---|
| JP | 2003-273355 A | 9/2003 |
| JP | 2006-073987 A | 3/2006 |

(Continued)

OTHER PUBLICATIONS

Decision to Grant for corresponding Japan Application No. 2025-038137, dated Apr. 28, 2026, with Machine Translation.

*Primary Examiner* — Mohammad M Hoque
(74) *Attorney, Agent, or Firm* — Renner, Otto, Boisselle & Sklar, LLP

(57) ABSTRACT

An active region includes a first super junction layer and an element layer. The first super junction layer alternately has a first region and a second region. A peripheral region includes a second super junction layer, a termination layer,
(Continued)

and an insulating layer. The second super junction layer alternately has a third region and a fourth region. The termination layer is provided on and in contact with the second super junction layer, and alternately has a fifth region and a sixth region. The fifth region is provided to correspond to the third region, and the sixth region is provided to correspond to the fourth region. An impurity concentration of the sixth region is larger than an impurity concentration of the fifth region and is 68 times or less as large as the impurity concentration of the fifth region.

10 Claims, 11 Drawing Sheets

(51) Int. Cl.
*H10D 62/60* (2025.01)
*H10D 62/832* (2025.01)
*H10D 64/27* (2025.01)

(58) Field of Classification Search
CPC .. H10D 30/668; H10D 30/665; H10D 12/031; H10D 62/127; H10D 62/157; H10D 62/158; H10D 62/112; H10D 62/405; H01L 21/046
USPC ........................................................... 257/77
See application file for complete search history.

(56) References Cited

U.S. PATENT DOCUMENTS

| | | | | |
|---|---|---|---|---|
| 2006/0033153 | A1 | 2/2006 | Onishi et al. | |
| 2009/0101974 | A1* | 4/2009 | Saito | H10D 62/127 257/342 |
| 2010/0032791 | A1* | 2/2010 | Hozumi | H10D 30/0291 257/493 |
| 2010/0059818 | A1* | 3/2010 | Sasaki | H10D 62/058 257/E29.256 |
| 2014/0191310 | A1* | 7/2014 | Ono | H10D 12/441 257/329 |
| 2014/0299961 | A1* | 10/2014 | Tamaki | H10D 62/393 257/492 |
| 2015/0200293 | A1* | 7/2015 | Eguchi | H01L 21/26513 257/493 |
| 2018/0269278 | A1* | 9/2018 | Yamaguchi | H10D 62/115 |
| 2019/0333988 | A1* | 10/2019 | Furuhashi | H10D 62/106 |
| 2020/0328273 | A1* | 10/2020 | Sakata | H10D 30/665 |
| 2021/0111245 | A1 | 4/2021 | Kosugi et al. | |
| 2021/0167167 | A1* | 6/2021 | Kawada | H10D 62/8325 |
| 2023/0317842 | A1* | 10/2023 | Baba | H10D 30/665 257/77 |

FOREIGN PATENT DOCUMENTS

| | | | |
|---|---|---|---|
| JP | 2013-041920 | A | 2/2013 |
| JP | 2015-133385 | A | 7/2015 |
| JP | 2018-019053 | A | 2/2018 |
| JP | 2018-152522 | A | 9/2018 |
| WO | 2018/029951 | A1 | 2/2018 |
| WO | 2019/160086 | A1 | 8/2019 |

* cited by examiner

SILICON CARBIDE SEMICONDUCTOR DEVICE HAVING AN ACTIVE REGION, A PERIPHERAL REGION, AND A FIRST ELECTRODE

TECHNICAL FIELD

The present disclosure relates to a silicon carbide semiconductor device. The present application claims a priority based on Japanese Patent Application No. 2020-118900 filed on Jul. 10, 2020, the entire contents of which are incorporated herein by reference.

BACKGROUND ART

Each of Japanese Patent Laying-Open No. 2006-73987 (PTL 1) and Japanese Patent Laying-Open No. 2003-273355 (PTL 2) describes a MOSFET (Metal Oxide Semiconductor Field Effect Transistor) having a super junction structure mainly for a silicon semiconductor.

CITATION LIST

Patent Literature

PTL 1: Japanese Patent Laying-Open No. 2006-73987
PTL 2: Japanese Patent Laying-Open No. 2003-273355

SUMMARY OF INVENTION

A silicon carbide semiconductor device according to the present disclosure includes a substrate, an active region, a peripheral region, and a first electrode. The substrate is composed of a silicon carbide semiconductor having a first conductivity type. The active region is provided on a portion of a first main surface of the substrate. A peripheral region is provided on the substrate and surrounds the active region when viewed in a plan view. The first electrode is provided on a second main surface of the substrate opposite to the first main surface. The active region includes a first super junction layer, an element layer, and a second electrode. The first super junction layer is provided above the substrate and alternately has a first region having the first conductivity type and a second region having a second conductivity type. The element layer is provided above the first super junction layer. The second electrode is provided on the element layer. The peripheral region includes a second super junction layer, a termination layer, and an insulating layer. The second super junction layer is provided above the substrate and alternately has a third region having the first conductivity type and a fourth region having the second conductivity type. The termination layer is provided on and in contact with the second super junction layer, and alternately has a fifth region having the second conductivity type and a sixth region having the second conductivity type. The insulating layer is in contact with each of an upper end surface of the fifth region and an upper end surface of the sixth region. The fifth region is provided to correspond to the third region, and the sixth region is provided to correspond to the fourth region. An impurity concentration of the sixth region is larger than an impurity concentration of the fifth region and is 68 times or less as large as the impurity concentration of the fifth region.

DETAILED DESCRIPTION

Figure 1:
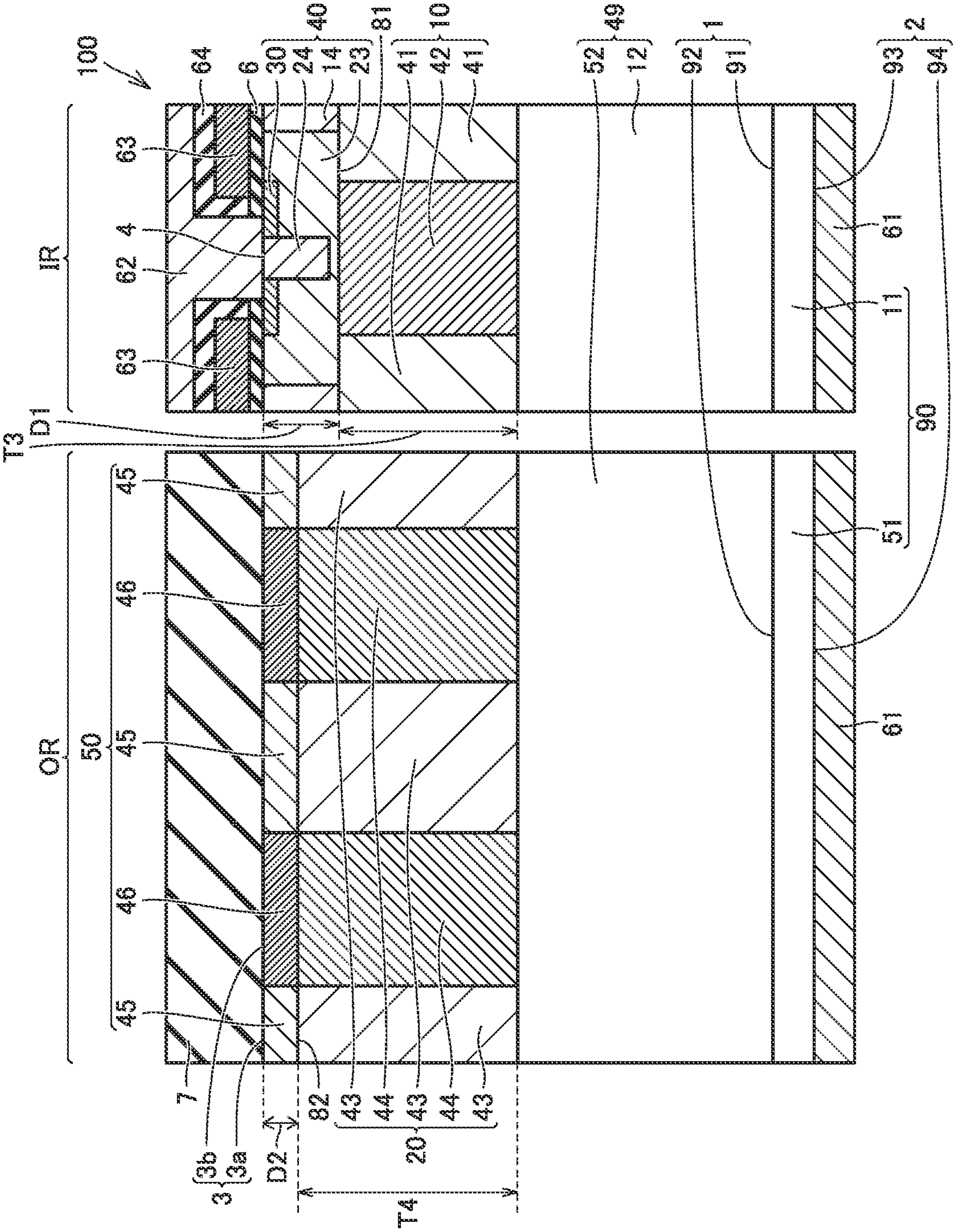
FIG. 1 is a schematic longitudinal cross sectional view showing a configuration of a silicon carbide semiconductor device according to a first embodiment.

Problem to be Solved by the Present Disclosure

It is an object of the present disclosure to provide a silicon carbide semiconductor device to improve reliability.

Advantageous Effect of the Present Disclosure

According to the present disclosure, a silicon carbide semiconductor device can be provided to improve reliability.

Description of Embodiments

First, embodiments of the present disclosure are listed and described. Regarding crystallographic indications in the present specification, an individual orientation is represented by [ ], a group orientation is represented by < >, and an individual plane is represented by ( ), and a group plane is represented by { }. A crystallographically negative index is normally expressed by putting "–" (bar) above a numeral; however, in the present specification, the crystallographically negative index is expressed by putting a negative sign before the numeral.

(1) A silicon carbide semiconductor device 100 according to the present disclosure includes a substrate 90, an active region IR, a peripheral region OR, and a first electrode 61. Substrate 90 is composed of a silicon carbide semiconductor having a first conductivity type. Active region IR is provided on a portion of first main surface 1 of substrate 90. Peripheral region OR is provided on substrate 90 and surrounds active region IR when viewed in a plan view. First electrode 61 is provided on a second main surface 2 of substrate 90 opposite to first main surface 1. Active region IR includes a first super junction layer 10, an element layer 40, and a second electrode 62. First super junction layer 10 is provided above substrate 90 and alternately has a first region 41 having the first conductivity type and a second region 42 having a second conductivity type. Element layer 40 is provided above first super junction layer 10. Second electrode 62 is provided on element layer 40. Peripheral region OR includes a second super junction layer 20, a termination layer 50, and an insulating layer 7. Second super junction layer 20 is provided above substrate 90, and alternately has a third region 43 having the first conductivity type and a fourth region 44 having the second conductivity type. Termination layer 50 is provided on and in contact with second super junction layer 20, and alternately has a fifth region 45 having the second conductivity type and a sixth region 46 having the second conductivity type. Insulating layer 7 is in contact with each of an upper end surface of fifth region 45 and an upper end surface of sixth region 46. Fifth region 45 is provided to correspond to third region 43, and sixth region 46 is provided to correspond to fourth region 44. An impurity concentration of sixth region 46 is larger than an impurity concentration of fifth region 45 and is 68 times or less as large as the impurity concentration of fifth region 45.

(2) In silicon carbide semiconductor device 100 according to (1), the impurity concentration of sixth region 46 may be larger than an impurity concentration of fourth region 44.

(3) In silicon carbide semiconductor device 100 according to (1) or (2), an absolute value of a difference between the impurity concentration of fifth region 45 and the impurity concentration of sixth region 46 may be substantially equal to a sum of an impurity concentration of third region 43 and an impurity concentration of fourth region 44.

(4) In silicon carbide semiconductor device 100 according to any one of (1) to (3), a first distance D1 between an upper end surface of element layer 40 and a boundary surface between element layer 40 and first super junction layer 10 may be larger than a second distance D2 between an upper end surface of termination layer 50 and a boundary surface between termination layer 50 and second super junction layer 20.

(5) In silicon carbide semiconductor device 100 according to any one of (1) to (4), each of first region 41 and third region 43 may have a first portion 71, and a second portion 72 located between first portion 71 and substrate 90. Each of second region 42 and fourth region 44 may have a third portion 73 in contact with first portion 71, and a fourth portion 74 in contact with second portion 72 and located between third portion 73 and substrate 90. In a cross section perpendicular to second main surface 2 and parallel to a direction from first region 41 toward second region 42, a width of second portion 72 may be larger than a width of first portion 71, a width of fourth portion 74 may be smaller than a width of third portion 73, the width of first portion 71 may be smaller than a height of first portion 71, and the width of third portion 73 may be smaller than a height of third portion 73. An impurity concentration of each of first portion 71 and third portion 73 may be larger than an impurity concentration of each of second portion 72 and fourth portion 74.

(6) In silicon carbide semiconductor device 100 according to any one of (1) to (5), an impurity concentration of each of first region 41 and third region 43 may be $3\times10^{16}$ $cm^{-3}$ or more and $5\times10^{17}$ $cm^{-3}$ or less. The impurity concentration of each of second region 42 and fourth region 44 may be $3\times10^{16}$ $cm^{-3}$ or more and $5\times10^{17}$ $cm^{-3}$ or less.

(7) In silicon carbide semiconductor device 100 according to any one of (1) to (6), a first buffer layer 12 having the first conductivity type may be provided between first super junction layer 10 and substrate 90. A second buffer layer 52 having the first conductivity type may be provided between second super junction layer 20 and substrate 90.

(8) In silicon carbide semiconductor device 100 according to any one of (1) to (7), element layer 40 may include a first impurity region 14 having the first conductivity type, a second impurity region 23 in contact with first impurity region 14 and having the second conductivity type, and a third impurity region 30 separated from first impurity region 14 by second impurity region 23 and having the first conductivity type. Element layer 40 may be provided with a trench 5 that has a side surface 8 constituted of each of first impurity region 14, second impurity region 23, and third impurity region 30, and that has a bottom portion 9 contiguous to side surface 8 and constituted of first impurity region 14. First electrode 61 may be a source electrode. Second electrode 62 may be a drain electrode. A gate electrode 63 may be provided inside trench 5.

(9) In silicon carbide semiconductor device 100 according to any one of (1) to (8), first main surface 1 may correspond to a {0001} plane or a plane inclined at an angle of 8° or less with respect to the (0001) plane.

DETAILS OF EMBODIMENTS OF THE PRESENT DISCLOSURE

Hereinafter, details of the embodiments of the present disclosure will be described. In the description below, the same or corresponding elements are denoted by the same reference characters and will not be described repeatedly.

First Embodiment

First, a configuration of a silicon carbide semiconductor device 100 according to a first embodiment will be described. FIG. 1 is a schematic longitudinal cross sectional view showing the configuration of silicon carbide semiconductor device 100 according to the first embodiment.

As shown in FIG. 1, silicon carbide semiconductor device 100 according to the first embodiment is a planar type MOSFET. Silicon carbide semiconductor device 100 according to the first embodiment mainly has a substrate 90, an active region IR, a peripheral region OR, and a first electrode 61, for example. Substrate 90 is composed of a silicon carbide semiconductor having a first conductivity type. The first conductivity type is, for example, n type conductivity. Substrate 90 includes an n type impurity that can provide the n type conductivity, such as N (nitrogen). Substrate 90 has a first main surface 1 and a second main surface 2. Second main surface 2 is opposite to first main surface 1. Second main surface 2 is a surface on a side opposite to first main surface 1.

Substrate 90 is composed of, for example, hexagonal silicon carbide having polytype 4H. First main surface 1 may correspond to, for example, a {0001} plane or a plane inclined at an angle of 8° or less with respect to the {0001} plane. Specifically, first main surface 1 may correspond to a (0001) plane or a plane inclined at an angle of 8° or less with respect to the (0001) plane. First main surface 1 may correspond to a (000-1) plane or a plane inclined at an angle of 8° or less with respect to the (000-1) plane. Substrate 90 has a first substrate portion 11 and a second substrate portion 51.

Active region IR is provided on a portion of first main surface 1 of substrate 90. First main surface 1 has a first zone 91 and a second zone 92. Active region IR is located on first zone 91. Active region IR mainly includes a first buffer layer 12, a first super junction layer 10, an element layer 40, a second electrode 62, a gate electrode 63, a gate insulating film 6, and a separation insulating film 64. First buffer layer 12 is located between first super junction layer 10 and substrate 90. First buffer layer 12 has, for example, the n type conductivity (first conductivity type). First buffer layer 12 includes an n type impurity that can provide the n type conductivity, such as N (nitrogen). First buffer layer 12 is in contact with first zone 91.

First super junction layer 10 is provided above substrate 90. First super junction layer 10 is, for example, in contact with first buffer layer 12. First super junction layer 10 alternately has first regions 41 and second regions 42. For example, first regions 41 and second regions 42 are alternately arranged along a direction parallel to first main surface 1. From another viewpoint, for example, it can be said that first regions 41 and second regions 42 are alternately arranged along a direction intersecting a thickness direction of substrate 90.

First region 41 has the n type conductivity (first conductivity type). First region 41 includes an n type impurity that can provide the n type conductivity, such as N (nitrogen). Second region 42 has a p type conductivity (second conductivity type). Second region 42 includes a p type impurity that can provide the p type conductivity, such as Al (aluminum).

Element layer 40 is provided above first super junction layer 10. Element layer 40 is, for example, a switching element portion. Element layer 40 has, for example, a first impurity region 14, a second impurity region 23, a third impurity region 30, and a fourth impurity region 24. First impurity region 14 is, for example, a drift region. First impurity region 14 has the n type conductivity (first conductivity type). First impurity region 14 includes an n type impurity that can provide the n type conductivity, such as N (nitrogen). First impurity region 14 is in contact with first region 41.

Second impurity region 23 is, for example, a body region. Second impurity region 23 is in contact with first impurity region 14. Second impurity region 23 has the p type conductivity (second conductivity type). Second impurity region 23 includes a p type impurity that can provide the p type conductivity, such as Al (aluminum). Second impurity region 23 is in contact with first region 41 and second region 42. The concentration of the p type impurity in second impurity region 23 may be higher than the concentration of the n type impurity in first impurity region 14.

Third impurity region 30 is, for example, a source region. Third impurity region 30 is separated from first impurity region 14 by second impurity region 23. Third impurity region 30 has the n type conductivity (first conductivity type). Third impurity region 30 includes an n type impurity that can provide the n type conductivity, such as P (phosphorus). The concentration of the n type impurity in third impurity region 30 may be higher than the concentration of the p type impurity in second impurity region 23.

Fourth impurity region 24 is, for example, a contact region. Fourth impurity region 24 is in contact with second impurity region 23 and third impurity region 30. Fourth impurity region 24 has the p type conductivity (second conductivity type). Fourth impurity region 24 includes a p type impurity that can provide the p type conductivity, such as Al (aluminum). The concentration of the p type impurity in fourth impurity region 24 may be higher than the concentration of the p type impurity in second impurity region 23.

Gate insulating film 6 is provided on element layer 40. Gate insulating film 6 is composed of silicon dioxide, for example. Gate insulating film 6 is in contact with, for example, each of first impurity region 14, second impurity region 23, and third impurity region 30. A channel can be formed in second impurity region 23 that is in contact with gate insulating film 6.

Gate electrode 63 is provided on gate insulating film 6. Gate electrode 63 is in contact with gate insulating film 6. Gate electrode 63 is composed of a conductor such as polysilicon doped with an impurity, for example.

Second electrode 62 is, for example, a source electrode. Second electrode 62 is provided on element layer 40. Second electrode 62 is in contact with third impurity region 30 and fourth impurity region 24. Second electrode 62 may cover a separation insulating film 64.

Separation insulating film 64 is provided to cover gate electrode 63. Separation insulating film 64 is in contact with each of gate electrode 63 and gate insulating film 6. Separation insulating film 64 is constituted of, for example, a NSG (None-doped Silicate Glass) film, a PSG (Phosphorus Silicate Glass) film, or the like. Separation insulating film 64 electrically insulates gate electrode 63 and second electrode 62 from each other.

First electrode 61 is, for example, a drain electrode. First electrode 61 is provided on second main surface 2 of substrate 90. Second main surface 2 has a third zone 93 and a fourth zone 94. Third zone 93 is located opposite to first zone 91. Fourth zone 94 is located opposite to second zone 92. First electrode 61 is in contact with each of third zone 93 and fourth zone 94.

Peripheral region OR is provided on substrate 90. Peripheral region OR is located on second zone 92 of first main surface 1. Peripheral region OR surrounds active region IR when viewed in a plan view. The plan view is a field of view in which silicon carbide semiconductor device 100 is seen in a direction perpendicular to first main surface 1. Peripheral region OR mainly includes a second buffer layer 52, a second super junction layer 20, a termination layer 50, and an insulating layer 7.

Second buffer layer 52 is located between second super junction layer 20 and substrate 90. Second buffer layer 52 has, for example, the n type conductivity (first conductivity type). Second buffer layer 52 includes an n type impurity that can provide the n type conductivity, such as N (nitrogen). Second buffer layer 52 is in contact with second zone 92 of first main surface 1. Second buffer layer 52 is electrically connected to first buffer layer 12.

Second super junction layer 20 is provided above substrate 90. Second super junction layer 20 is in contact with second buffer layer 52, for example. Second super junction layer 20 alternately has third regions 43 and fourth regions 44. For example, third regions 43 and fourth regions 44 are alternately arranged along a direction parallel to first main surface 1. From another viewpoint, for example, it can be said that third regions 43 and fourth regions 44 are alternately arranged along a direction intersecting a thickness direction of substrate 90. A direction in which third regions 43 and fourth regions 44 are arranged is the same as the direction in which first regions 41 and second regions 42 are arranged.

Third region 43 has the n type conductivity (first conductivity type). Third region 43 includes an n type impurity that can provide the n type conductivity, such as N (nitrogen). Fourth region 44 has the p type (second conductivity type). Fourth region 44 includes a p type impurity that can provide the p type conductivity, such as Al (aluminum).

Termination layer 50 is provided on and in contact with second super junction layer 20. Termination layer 50 alternately has fifth regions 45 and sixth regions 46. Fifth regions 45 are provided to correspond to third regions 43, and sixth regions 46 are provided to correspond to fourth regions 44. Fifth regions 45 are in contact with third regions 43. Sixth regions 46 are in contact with fourth regions 44. For example, fifth regions 45 and sixth regions 46 are alternately arranged along the direction parallel to first main surface 1. From another viewpoint, for example, it can be said that fifth regions 45 and sixth regions 46 are alternately arranged along the direction intersecting the thickness direction of substrate 90.

Each of fifth regions 45 and sixth regions 46 has the p type conductivity (second conductivity type). Each of fifth regions 45 and sixth regions 46 includes a p type impurity that can provide the p type conductivity, such as Al (aluminum). The impurity concentration of sixth region 46 is larger than the impurity concentration of fifth region 45 and is 68 times or less as large as the impurity concentration of fifth region 45. The lower limit of the impurity concentration of sixth region 46 is not particularly limited, but may be, for example, 1.09 times or more or 1.58 times or more as large as the impurity concentration of fifth region 45. The upper limit of the impurity region of sixth region 46 is not particularly limited, but may be, for example, 20 times or less, 33.3 times or less, or 55 times or less as large as the impurity concentration of fifth region 45.

Fifth region 45 is formed, for example, by implanting a p type impurity into third region 43. Similarly, sixth region 46 is formed, for example, by implanting a p type impurity into fourth region 44. In this case, the impurity concentration of sixth region 46 is larger than the impurity concentration of fourth region 44. The absolute value of a difference between the impurity concentration of fifth region 45 and the impurity concentration of sixth region 46 may be substantially equal to the sum of the impurity concentration of third region 43 and the impurity concentration of fourth region 44. Specifically, a value obtained by dividing the absolute value of the difference between the impurity concentration of fifth region 45 and the impurity concentration of sixth region 46 by the sum of the impurity concentration of third region 43 and the impurity concentration of fourth region 44 is, for example, 0.8 or more and 1.2 or less.

The impurity concentration of first region 41 is substantially the same as the impurity concentration of third region 43. The impurity concentration of each of first region 41 and third region 43 is, for example, $3\times10^{16}$ $cm^{-3}$ or more and $5\times10^{7}$ $cm^{-3}$ or less. The lower limit of the impurity concentration of each of first region 41 and third region 43 is not particularly limited, but may be, for example, $4\times10^{16}$ $cm^{-3}$ or more, or $5\times10^{16}$ $cm^{-3}$ or more. The upper limit of the impurity concentration of each of first region 41 and third region 43 is not particularly limited, but may be, for example, $4\times10^{17}$ $cm^{-3}$ or less, or $3\times10^{17}$ $cm^{-3}$ or less.

The impurity concentration of second region 42 is substantially the same as the impurity concentration of fourth region 44. The impurity concentration of each of second region 42 and fourth region 44 may be, for example, $3\times10^{16}$ $cm^{-3}$ or more and $5\times10^{17}$ $cm^{-3}$ or less. The lower limit of the impurity concentration of each of second region 42 and fourth region 44 is not particularly limited, but may be, for example, $4\times10^{16}$ $cm^{-3}$ or more, or $5\text{-}10^{16}$ $cm^{-3}$ or more. The upper limit of the impurity concentration of each of second region 42 and fourth region 44 is not particularly limited, but may be, for example, $4\times10^{17}$ $cm^{-3}$ or less, or $3\times10^{17}$ $cm^{-3}$ or less.

Insulating layer 7 is provided on termination layer 50. Termination layer 50 has a third main surface 3. Third main surface 3 is in contact with insulating layer 7. Third main surface 3 has a first upper end surface **3*a* and a second upper end surface 3*b*. Insulating layer 7 is in contact with each of the upper end surface (first upper end surface 3*a*) of fifth region 45 and the upper end surface (second upper end surface 3*b*) of sixth region 46. Fifth region 45 is located between third region 43 and insulating layer 7. Sixth region 46 is located between fourth region 44 and insulating layer 7. Insulating layer 7 is composed of, for example, an oxide film such as an LTO (Low Temperature Oxide) film, an HTO (High Temperature Oxide) film, an NSG film, or a PSG film. A thermal oxide film may be formed as a base of insulating layer 7**.

As shown in FIG. 1, a first distance D1 between an upper end surface (fourth main surface 4) of element layer 40 and a boundary surface (first boundary surface 81) between element layer 40 and first super junction layer 10 is larger than a second distance D2 between an upper end surface (third main surface 3) of termination layer 50 and a boundary surface (second boundary surface 82) between termination layer 50 and second super junction layer 20. A value obtained by subtracting second distance D2 from first distance D1 may be 0.5 μm or more, or 1 μm or more. The thickness (fourth thickness T4) of second super junction layer 20 is larger than the thickness (third thickness T3) of first super junction layer 10.

Second Embodiment

Next, a configuration of a silicon carbide semiconductor device 100 according to a second embodiment will be described. The configuration of silicon carbide semiconductor device 100 according to the second embodiment is different from the configuration of silicon carbide semiconductor device 100 according to the first embodiment mainly in that peripheral region OR has a plurality of peripheral region portions, and is the same as the configuration of silicon carbide semiconductor device 100 according to the first embodiment in terms of the other points. The following mainly describes the configuration different from the configuration of silicon carbide semiconductor device 100 according to the first embodiment.

Figure 2:
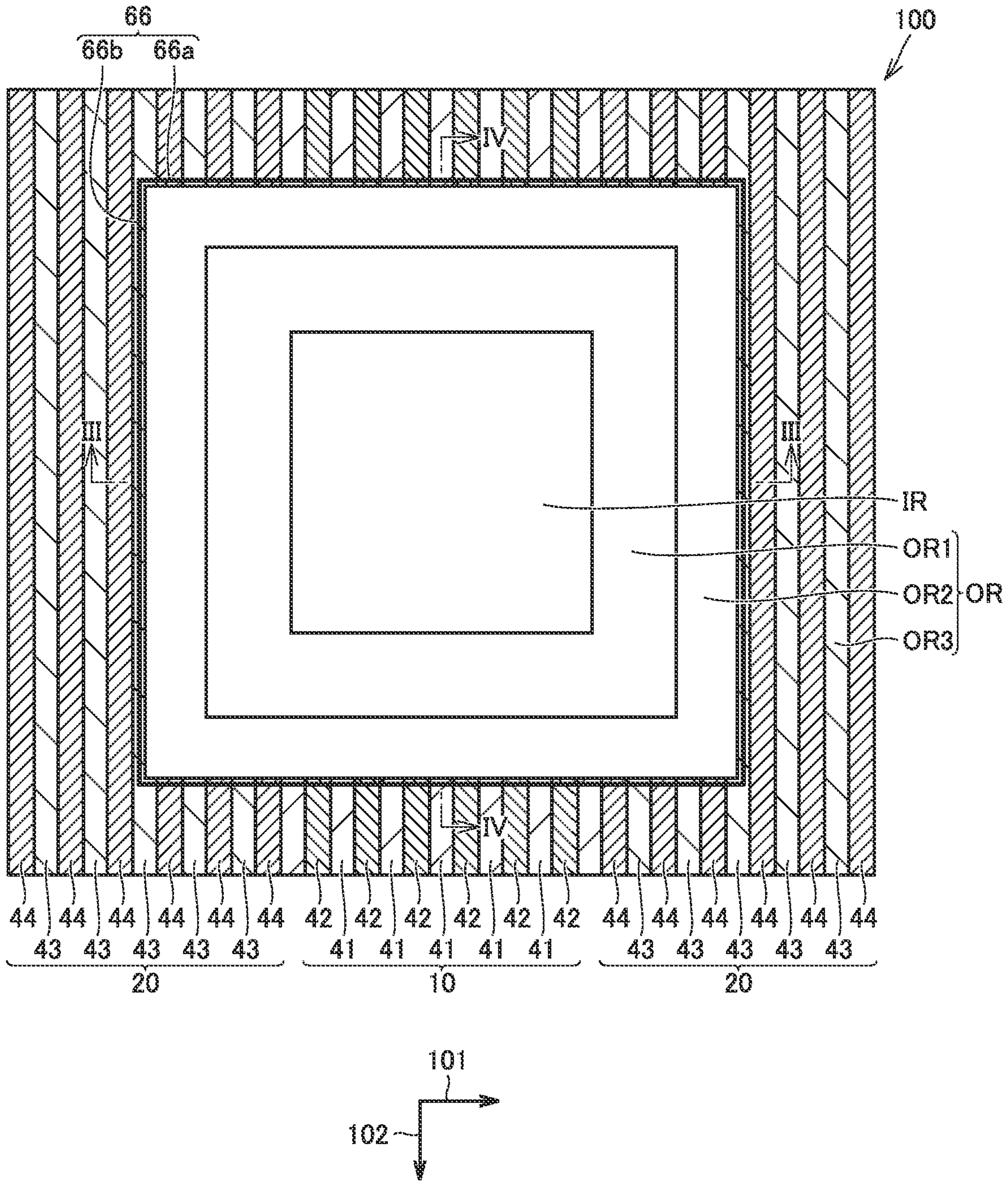
FIG. 2 is a partial schematic transverse cross sectional view showing a configuration of a silicon carbide semiconductor device according to a second embodiment.

FIG. 2 is a partial schematic transverse cross sectional view showing the configuration of silicon carbide semiconductor device 100 according to the second embodiment. As shown in FIG. 2, when viewed in a plan view, peripheral region OR surrounds active region IR. Peripheral region OR has a first peripheral region portion OR1, a second peripheral region portion OR2, and a third peripheral region portion OR3. When viewed in a plan view, first peripheral region portion OR1 surrounds active region IR. First peripheral region portion OR1 is contiguous to active region IR. When viewed in a plan view, second peripheral region portion OR2 surrounds first peripheral region portion OR1. Second peripheral region portion OR2 is contiguous to first peripheral region portion OR1.

Silicon carbide semiconductor device 100 has first super junction layer 10 and second super junction layer 20. First super junction layer 10 has first regions 41 and second regions 42. First regions 41 and second regions 42 are alternately arranged along first direction 101. When viewed in a plan view, the long side direction of each of first region 41 and second region 42 is a second direction 102. When viewed in a plan view, the short side direction of each of first region 41 and second region 42 is a first direction 101.

Each of first direction 101 and second direction 102 is parallel to first main surface 1. First direction 101 is a direction perpendicular to second direction 102. First direction 101 is, for example, a <1-100> direction. Second direction 102 is, for example, a <11-20> direction. First direction 101 may be, for example, a direction obtained by projecting the <1-100> direction onto first main surface 1. Second direction 102 may be, for example, a direction obtained by projecting the <11-20> direction onto first main surface 1.

Second super junction layer 20 has third regions 43 and fourth regions 44. Third regions 43 and fourth regions 44 are alternately arranged along first direction 101. When viewed in a plan view, the long side direction of each of third region 43 and fourth region 44 is a second direction 102. When viewed in a plan view, the short side direction of each of third region 43 and fourth region 44 is a first direction 101.

When viewed in a plan view, third peripheral region portion OR3 surrounds second peripheral region portion OR2. Third peripheral region portion OR3 is contiguous to second peripheral region portion OR2. Third peripheral region portion OR3 has, for example, a channel stopper 66. When viewed in a plan view, channel stopper 66 surrounds second peripheral region portion OR2. Channel stopper 66 has, for example, the n type conductivity (first conductivity type). The impurity concentration of channel stopper 66 is, for example, larger than the impurity concentration of each of first region 41 and third region 43.

As shown in FIG. 2, channel stopper 66 has a first channel stopper region 66*a* extending along first direction 101 and a second channel stopper region 66*b* extending along second direction 102. Second channel stopper region 66*b* may be provided along third region 43. First channel stopper region 66*a* may extend through third regions 43 and fourth regions 44. First channel stopper region 66*a* may extend through first regions 41 and second regions 42.

Figure 3:
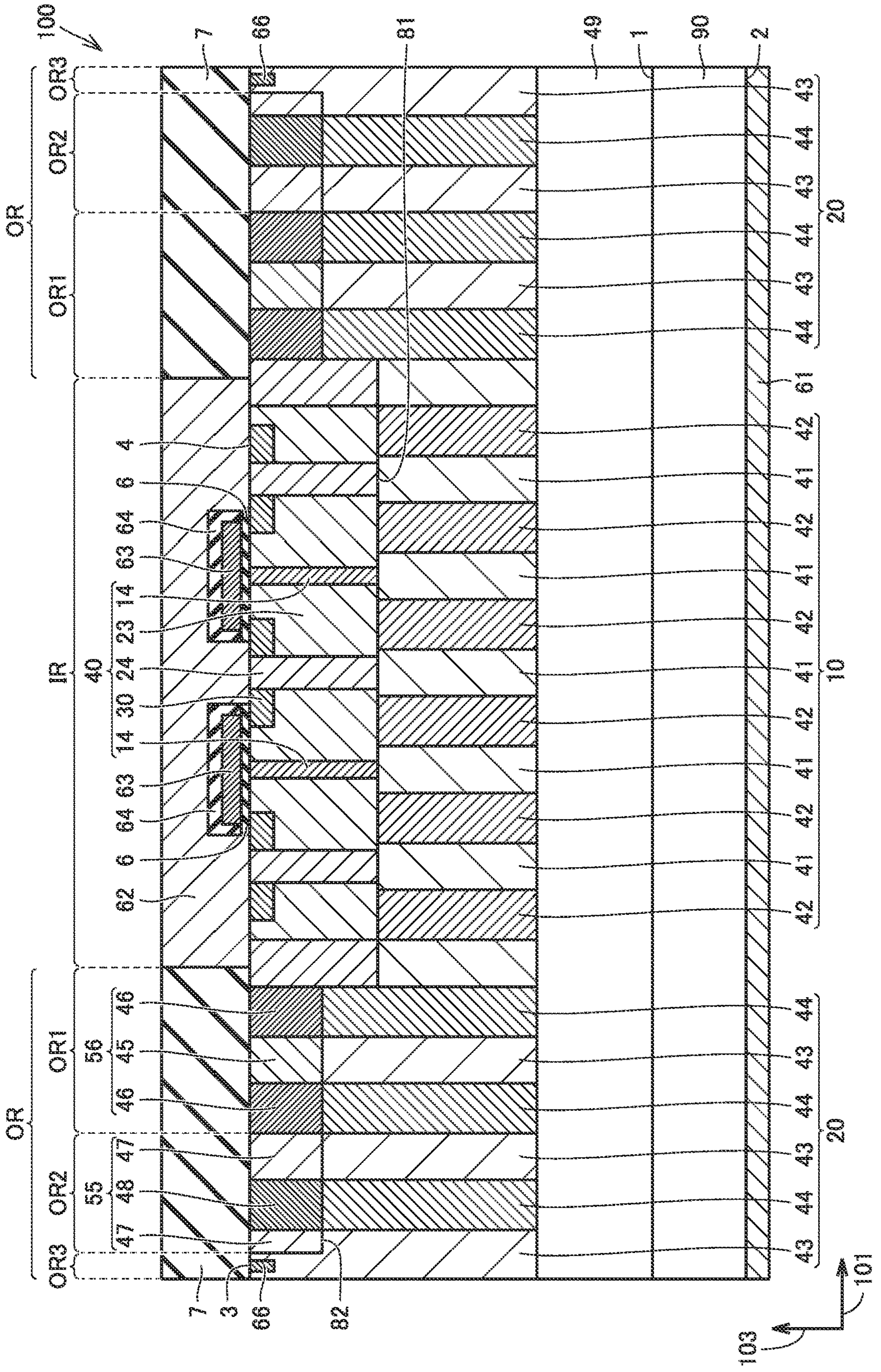
FIG. 3 is a schematic longitudinal cross sectional view taken along a line III-III of FIG. 2.

FIG. 3 is a schematic longitudinal cross sectional view taken along a line Ill-M of FIG. 2. As shown in FIG. 3, first peripheral region portion OR1 has a first termination layer 56. First termination layer 56 has a fifth region 45 and a sixth region 46. Second peripheral region portion OR2 has a second termination layer 55. Second termination layer 55 has a seventh region 47 and an eighth region 48. Seventh region 47 corresponds to third region 43, and eighth region 48 corresponds to fourth region 44. Seventh region 47 is in contact with third region 43. Eighth region 48 is in contact with fourth region 44. Insulating layer 7 is in contact with, for example, first termination layer 56, second termination layer 55, and channel stopper 66.

The impurity concentration of second termination layer 55 may be smaller than the impurity concentration of first termination layer 56. Specifically, the impurity concentration of seventh region 47 may be smaller than the impurity concentration of fifth region 45. Similarly, the impurity concentration of eighth region 48 may be smaller than the impurity concentration of sixth region 46. In the above description, a two-stage JTE (Junction Termination Extension) having two termination layers has been illustrated; however, a three-stage JTE having three termination layers may be employed.

As shown in FIG. 3, in a transverse cross section through first region 41 and second region 42, the height of first region 41 in third direction 103 may be larger than the width of first region 41 in first direction 101. Similarly, in the transverse cross section through first region 41 and second region 42, the height of second region 42 in third direction 103 may be larger than the width of second region 42 in first direction 101. Third direction 103 is a direction perpendicular to each of first direction 101 and second direction 102. Third direction 103 is, for example, a <0001> direction. Third direction 103 may be a direction inclined with respect to the <0001> direction, for example.

As shown in FIG. 3, in a transverse cross section through third region 43 and fourth region 44, the height of third region 43 in third direction 103 may be larger than the width of third region 43 in first direction 101. Similarly, in the transverse cross section through third region 43 and fourth region 44, the height of fourth region 44 in third direction 103 may be larger than the width of fourth region 44 in first direction 101.

In a transverse cross section through first region 41 and third region 43, the height of third region 43 in third direction 103 may be larger than the height of first region 41 in third direction 103. Similarly, in a transverse cross section through second region 42 and fourth region 44, the height of fourth region 44 in third direction 103 may be larger than the height of second region 42 in third direction 103.

As shown in FIG. 3, when viewed in a cross sectional view, a plurality of gate electrodes 63 may be arranged along first direction 101. Similarly, a plurality of first impurity regions 14, a plurality of second impurity regions 23, a plurality of third impurity regions 30, and a plurality of fourth impurity regions 24 may be arranged along first direction 101. Each of fourth impurity regions 24 may extend through third impurity region 30 and may be in contact with first region 41.

Figure 4:
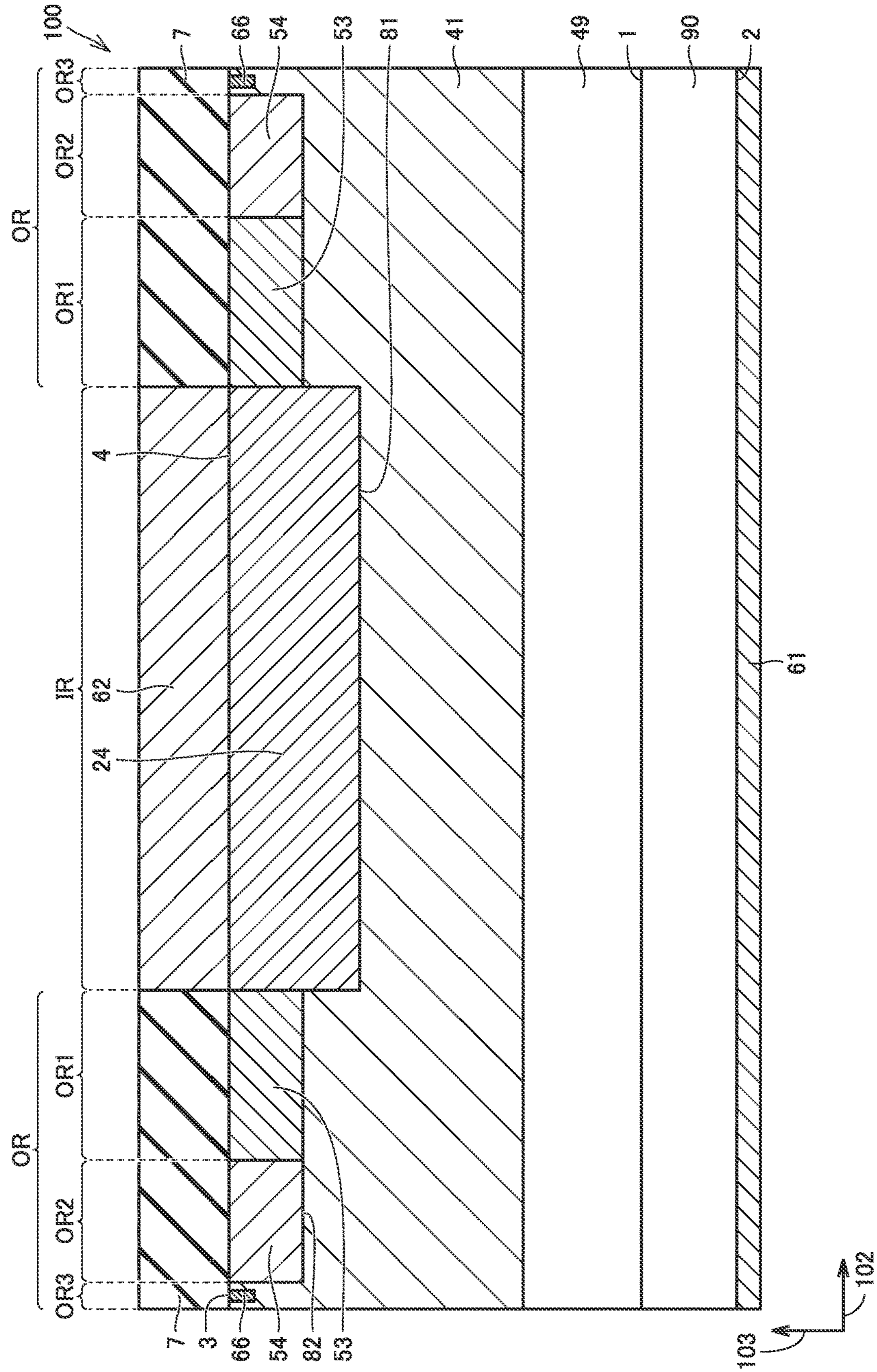
FIG. 4 is a schematic longitudinal cross sectional view taken along a line IV-IV of FIG. 2.

FIG. 4 is a schematic longitudinal cross sectional view taken along a line IV-IV of FIG. 2. As shown in FIG. 4, peripheral region OR has a plurality of JTE regions. First peripheral region portion OR1 has a first JTE region 53. Second peripheral region portion OR2 has a second JTE region 54. Second JTE region 54 is contiguous to first JTE region 53. Each of first JTE region 53 and second JTE region 54 has, for example, the p type conductivity. The impurity concentration of second JTE region 54 is smaller than the impurity concentration of first JTE region 53, for example. A value obtained by dividing the impurity concentration of second JTE region 54 by the impurity concentration of first JTE region 53 is, for example, 0.5.

As shown in FIG. 4, first region 41 may extend to peripheral region OR along second direction 102. In peripheral region OR, first region 41 may be in contact with first JTE region 53, second JTE region 54, and channel stopper 66. In the present embodiment, it has been illustrated that peripheral region OR has two JTE regions; however, the number of the JTE regions is not limited to two. Peripheral region OR may have three or more JTE regions, for example. In this case, the impurity concentrations of the JTE regions may be smaller in a direction toward the outer side when viewed from active region IR.

Third Embodiment

Next, a configuration of a silicon carbide semiconductor device 100 according to a third embodiment will be described. The configuration of silicon carbide semiconductor device 100 according to the third embodiment is mainly different from the configuration of silicon carbide semiconductor device 100 according to the first embodiment in that active region IR is a trench type MOSFET, and is the same as the configuration of silicon carbide semiconductor device 100 according to the first embodiment in terms of the other points. The following mainly describes the configuration different from the configuration of silicon carbide semiconductor device 100 according to the first embodiment.

Figure 5:
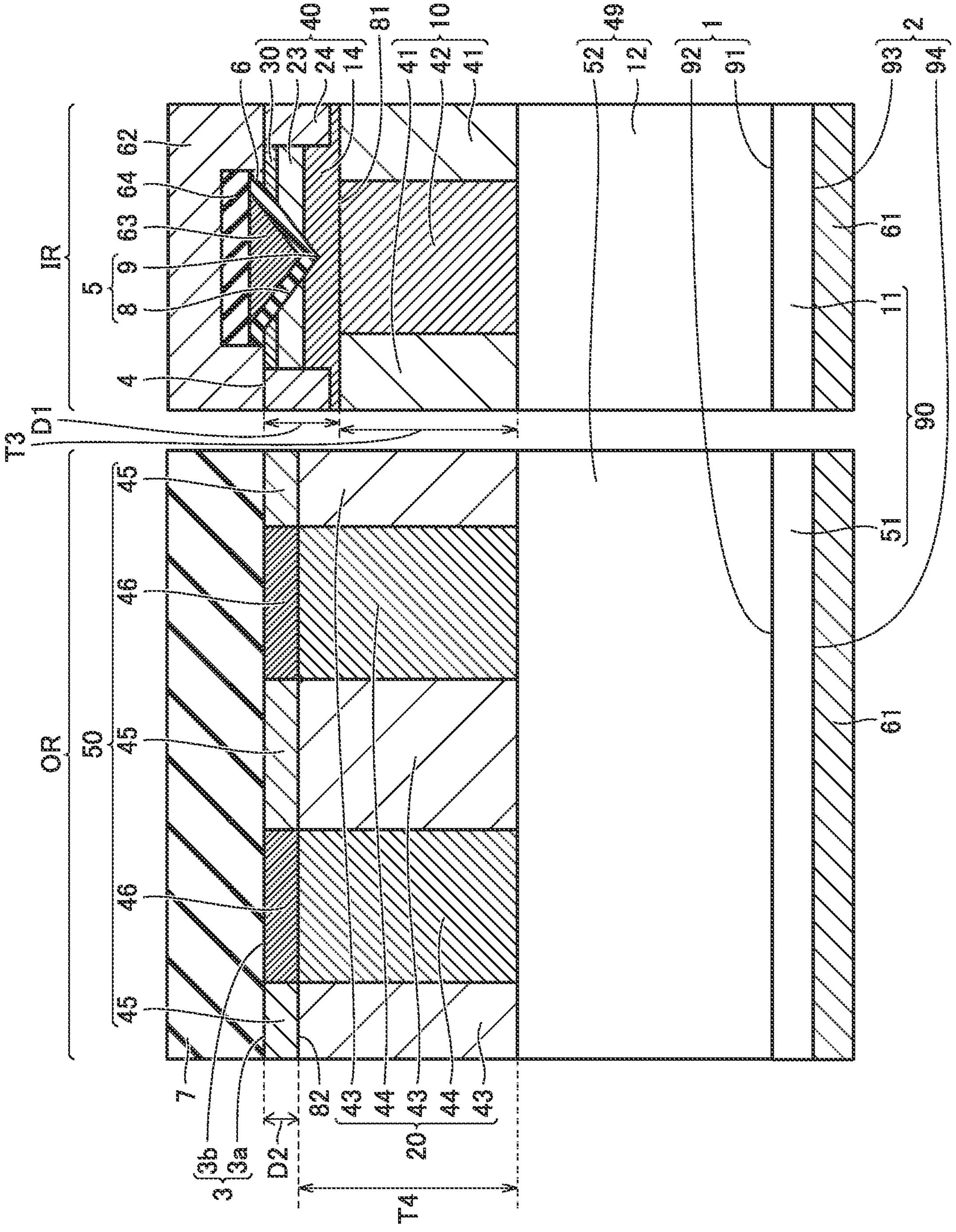
FIG. 5 is a schematic longitudinal cross sectional view showing a configuration of a silicon carbide semiconductor device according to a third embodiment.

FIG. 5 is a schematic longitudinal cross sectional view showing the configuration of silicon carbide semiconductor device 100 according to the third embodiment. As shown in FIG. 5, a trench 5 is provided in element layer 40. Trench 5 has a V shape, for example. Trench 5 is defined by a side surface 8 and a bottom portion 9. Side surface 8 is constituted of each of first impurity region 14, second impurity region 23, and third impurity region 30. Bottom portion 9 is contiguous to side surface 8. Bottom portion 9 is constituted of first impurity region 14.

At least a portion of gate insulating film 6 is provided inside trench 5, for example. Gate insulating film 6 is in contact with each of first impurity region 14, second impurity region 23, and third impurity region 30 at side surface 8. Gate insulating film 6 is in contact with first impurity region 14 at bottom portion 9. At least a portion of gate electrode 63 is provided inside trench 5, for example.

Fourth Embodiment

Next, a configuration of a silicon carbide semiconductor device 100 according to a fourth embodiment will be described. The configuration of silicon carbide semiconductor device 100 according to the fourth embodiment is mainly different from the configuration of silicon carbide semiconductor device 100 according to the second embodiment in that active region IR is a trench type MOSFET, and is the same as the configuration of silicon carbide semiconductor device 100 according to the second embodiment in terms of the other points. The following mainly describes the configuration different from the configuration of silicon carbide semiconductor device 100 according to the second embodiment.

Figure 6:
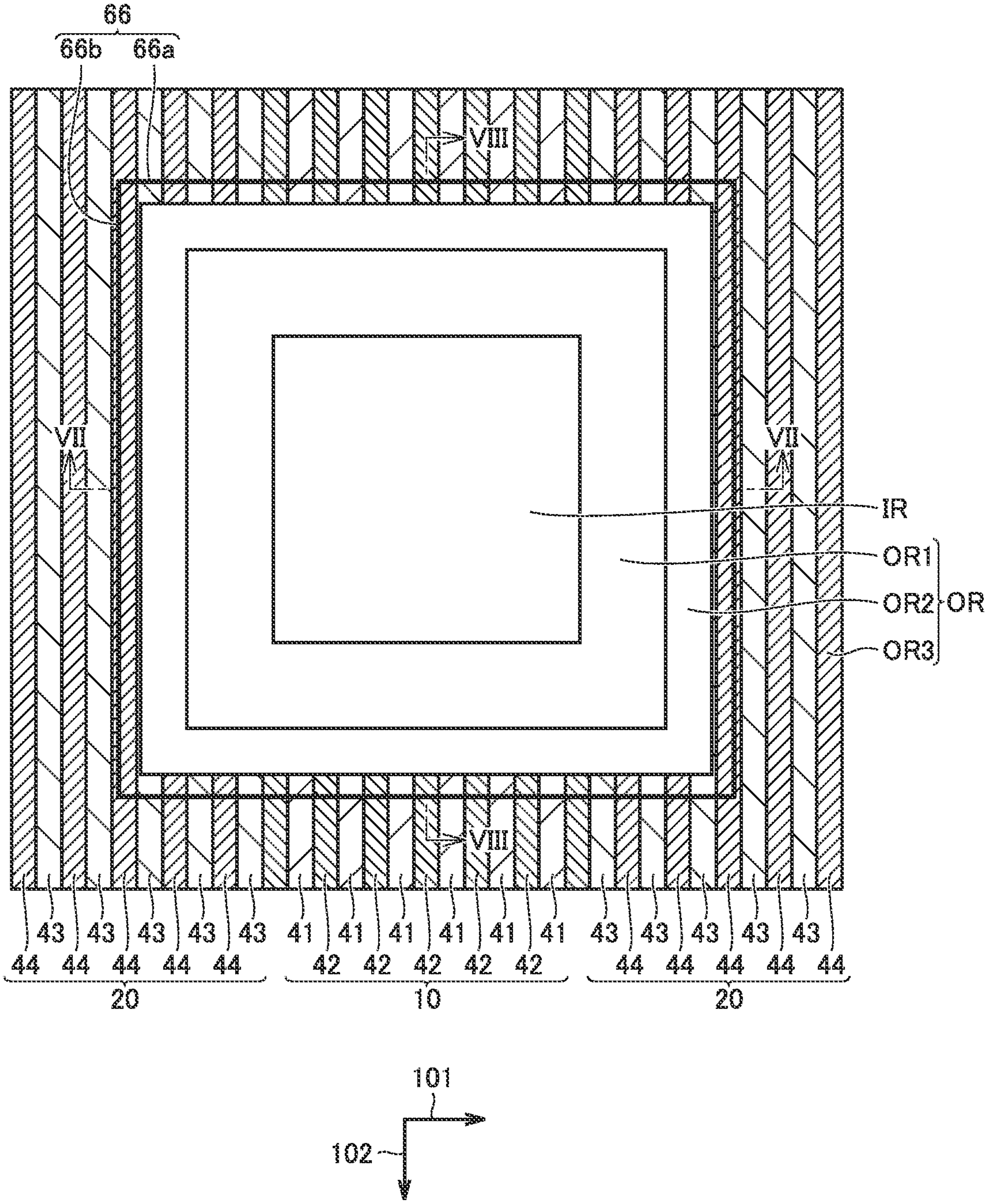
FIG. 6 is a partial schematic transverse cross sectional view showing a configuration of a silicon carbide semiconductor device according to a fourth embodiment.

FIG. 6 is a partial schematic transverse cross sectional view showing the configuration of silicon carbide semiconductor device 100 according to the fourth embodiment. As shown in FIG. 6, when viewed in a plan view, peripheral region OR surrounds active region IR. Peripheral region OR has a first peripheral region portion OR1, a second peripheral region portion OR2, and a third peripheral region portion OR3. Channel stopper 66 has a first channel stopper region 66*a* extending along first direction 101 and a second channel stopper region 66*b* extending along second direction 102. Second channel stopper region 66*b* may be provided along fourth region 44. First channel stopper region 66*a* may extend through third regions 43 and fourth regions 44. First channel stopper region 66*a* may extend through first regions 41 and second regions 42.

Figure 7:
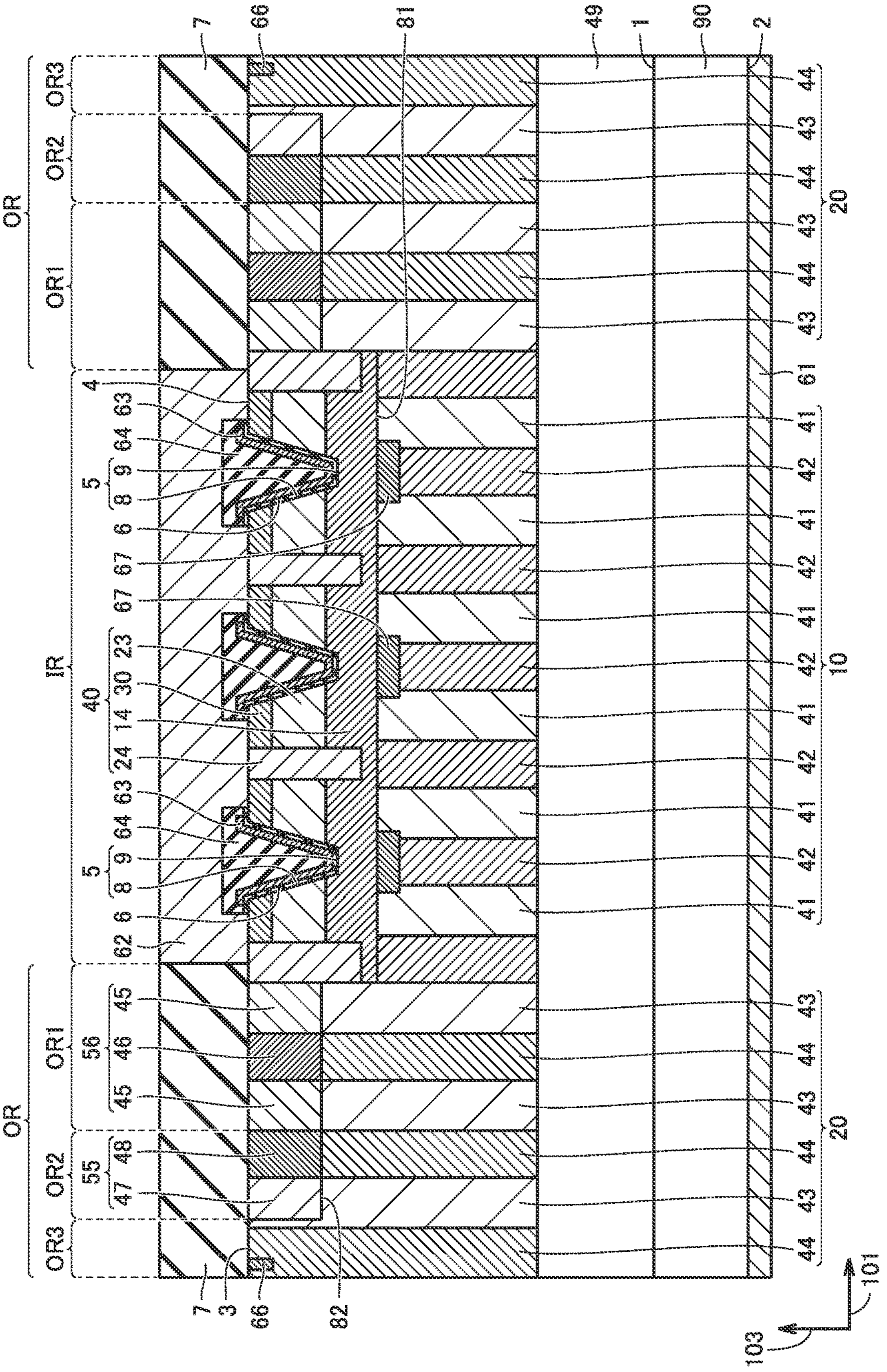
FIG. 7 is a schematic longitudinal cross sectional view taken along a line VII-VII of FIG. 6.

FIG. 7 is a schematic longitudinal cross sectional view along a line VII-VII of FIG. 6. As shown in FIG. 7, trenches 5 are provided in element layer 40. Each of trenches 5 is defined by a side surface 8 and a bottom portion 9. Side surface 8 is constituted of each of first impurity region 14, second impurity region 23, and third impurity region 30. Bottom portion 9 is contiguous to side surface 8. Bottom portion 9 is constituted of first impurity region 14.

At least a portion of gate insulating film 6 is provided inside trench 5, for example. Gate insulating film 6 is in contact with each of first impurity region 14, second impurity region 23, and third impurity region 30 at side surface 8. Gate insulating film 6 is in contact with the first impure region at bottom portion 9. At least a portion of gate electrode 63 is provided inside trench 5, for example. At least a portion of separation insulating film 64 is provided inside trench 5, for example.

Active region IR may have, for example, a sixth impurity region 67. Sixth impurity region 67 has, for example, the p type conductivity (second conductivity type). Sixth impurity region 67 faces bottom portion 9 of trench 5. Sixth impurity region 67 is in contact with, for example, first region 41, second region 42, and first impurity region 14. Sixth impurity region 67 is located between second region 42 and first impurity region 14 in third direction 103. In first direction 101, the width of sixth impurity region 67 may be larger than the width of second region 42. In first direction 101, the width of sixth impurity region 67 may be larger than the width of bottom portion 9 of trench 5.

Figure 8:
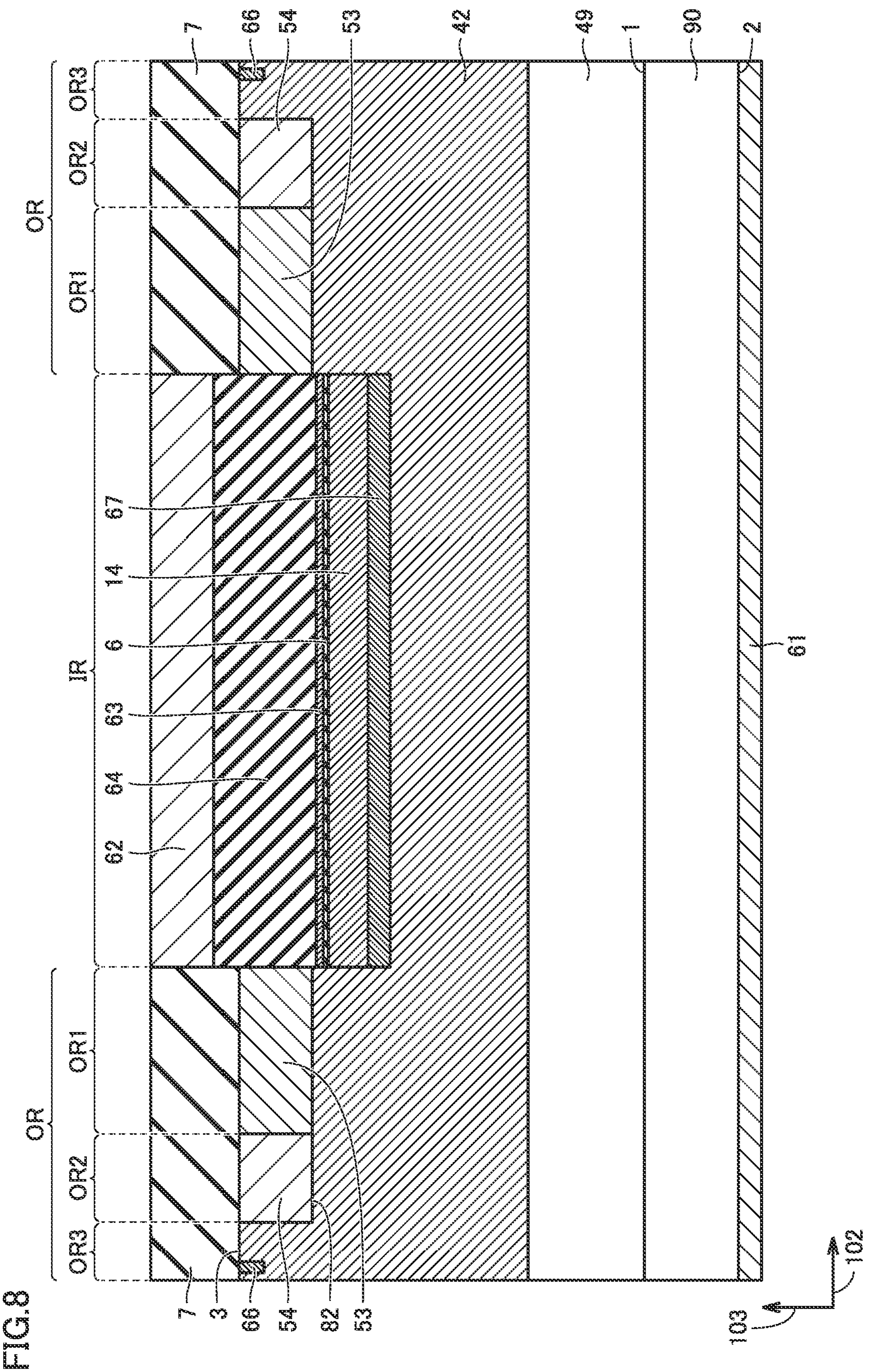
FIG. 8 is a schematic longitudinal cross sectional view taken along a line VIII-VIII of FIG. 6.

FIG. 8 is a schematic longitudinal cross sectional view taken along a line VIII-VIII of FIG. 6. As shown in FIG. 8, sixth impurity region 67 may extend along second direction 102. The width of sixth impurity region 67 in second direction 102 may be larger than the width of sixth impurity region 67 in first direction 101. Similarly, first impurity region 14 may extend along second direction 102. The width of first impurity region 14 in second direction 102 may be larger than the width of first impurity region 14 in first direction 101.

As shown in FIG. 8, second region 42 may extend to peripheral region OR along second direction 102. In peripheral region OR, second region 42 may be in contact with first JTE region 53, second JTE region 54, and channel stopper 66.

Fifth Embodiment

Next, a configuration of a silicon carbide semiconductor device 100 according to a fifth embodiment will be described. The configuration of silicon carbide semiconductor device 100 according to the fifth embodiment is mainly different from the configuration of silicon carbide semiconductor device 100 according to the first embodiment in that active region IR is a PN diode, and is the same as the configuration of silicon carbide semiconductor device 100 according to the first embodiment in terms of the other points. The following mainly describes the configuration different from the configuration of silicon carbide semiconductor device 100 according to the first embodiment.

Figure 9:
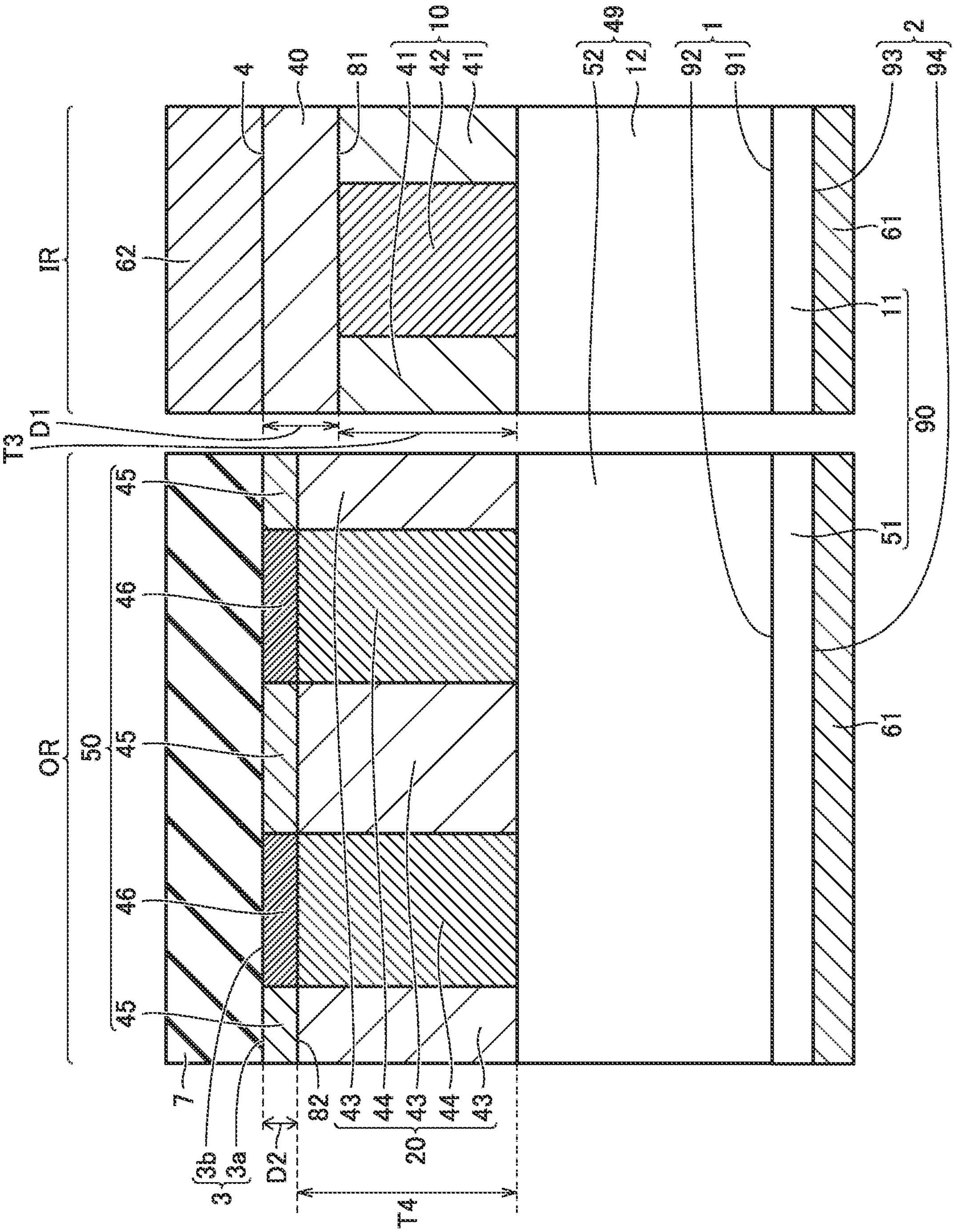
FIG. 9 is a schematic longitudinal cross sectional view showing a configuration of a silicon carbide semiconductor device according to a fifth embodiment.

FIG. 9 is a schematic longitudinal cross sectional view showing the configuration of silicon carbide semiconductor device 100 according to the fifth embodiment. As shown in FIG. 9, element layer 40 may be a rectifying element portion, for example. Element layer 40 has, for example, the p type conductivity (second conductivity type). Second electrode 62 is in contact with element layer 40. Second electrode 62 is provided on element layer 40. Element layer 40 is provided on first super junction layer 10. For example, element layer 40 is in contact with each of first region 41 and second region 42. First electrode 61 is, for example, a cathode electrode. Second electrode 62 is, for example, an anode electrode.

Sixth Embodiment

Next, a configuration of a silicon carbide semiconductor device 100 according to a sixth embodiment will be described. The configuration of silicon carbide semiconductor device 100 according to the sixth embodiment is mainly different from the configuration of silicon carbide semiconductor device 100 according to the third embodiment in that each of first region 41 and third region 43 has first portion 71 and second portion 72 and each of second region 42 and fourth region 44 has third portion 73 and fourth portion 74, and is the same as the configuration of silicon carbide semiconductor device 100 according to the third embodiment in terms of the other points. The following mainly describes the configuration different from the configuration of silicon carbide semiconductor device 100 according to the third embodiment.

Figure 10:
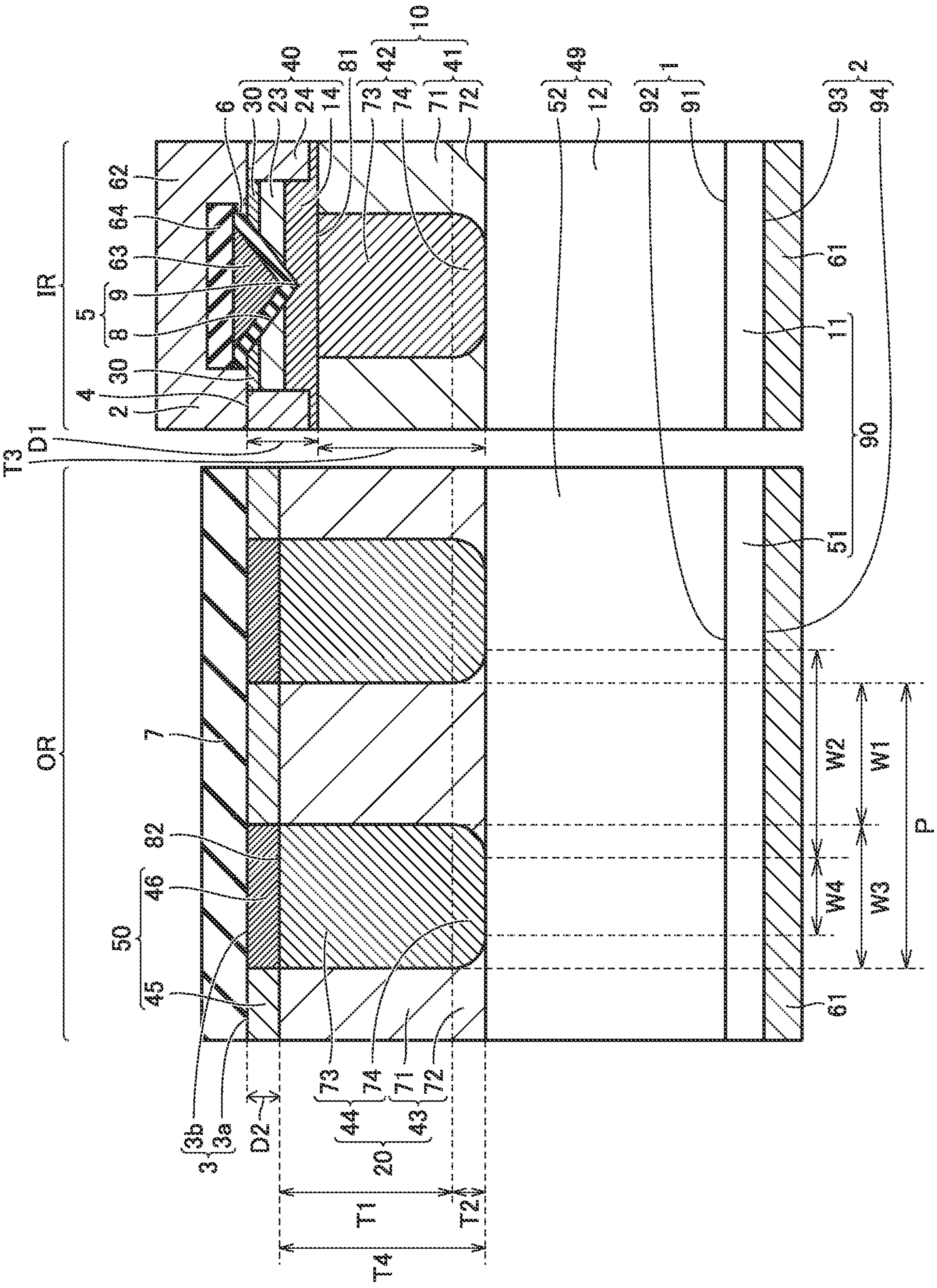
FIG. 10 is a schematic longitudinal cross sectional view showing a configuration of a silicon carbide semiconductor device according to a sixth embodiment.

FIG. 10 is a schematic longitudinal cross sectional view showing the configuration of silicon carbide semiconductor device 100 according to the sixth embodiment. As shown in FIG. 10, each of first region 41 and third region 43 has a first portion 71 and a second portion 72. Second portion 72 is contiguous to first portion 71. Second portion 72 is located between first portion 71 and substrate 90. First portion 71 may be in contact with first impurity region 14. First portion 71 may be in contact with fifth region 45. Second portion 72 may be in contact with first buffer layer 12. Second portion 72 may be in contact with second buffer layer 52.

As shown in FIG. 10, each of second region 42 and fourth region 44 has a third portion 73 and a fourth portion 74. Third portion 73 is in contact with first portion 71. Fourth portion 74 is in contact with second portion 72. Fourth portion 74 is contiguous to third portion 73. Fourth portion 74 is located between third portion 73 and substrate 90. Third portion 73 may be in contact with first impurity region 14. Third portion 73 may be in contact with sixth region 46. Fourth portion 74 may be in contact with first buffer layer 12. Fourth portion 74 may be in contact with second buffer layer 52.

Third portion 73 and first portion 71 are adjacent to each other in first direction 101. Third portions 73 and first portions 71 are alternately arranged in first direction 101. Fourth portion 74 and second portion 72 are adjacent to each other in first direction 101. Fourth portions 74 and second portions 72 are alternately arranged in first direction 101.

An impurity concentration in third portion 73 may be higher than an impurity concentration in fourth portion 74. An impurity concentration in first portion 71 is substantially the same as an impurity concentration in second portion 72. The impurity concentration in first portion 71 is substantially the same as the impurity concentration in third portion 73. The impurity concentration in fourth portion 74 may be lower than the impurity concentration in second portion 72.

The impurity concentration of each of first portion 71 and third portion 73 may be, for example, $3\times10^{16}$ $cm^{-3}$ or more and $5\text{-}10^{17}$ $cm^{-3}$ or less. The lower limit of the impurity concentration of each of first portion 71 and third portion 73 is not particularly limited, but may be, for example, $4\times10^{16}$ $cm^{-3}$ or more, or $5\times10^{16}$ $cm^{-3}$ or more. The upper limit of the impurity concentration of each of first portion 71 and third portion 73 is not particularly limited, but may be, for example, $4\times10^{17}$ $cm^{-3}$ or less, or $3\times10^{7}$ $cm^{-3}$ or less.

As shown in FIG. 10, in a cross section perpendicular to second main surface 2 and parallel to a direction from first region 41 toward second region 42, a width of second portion 72 is larger than a width (first width W1) of first portion 71. A width of second portion 72 may be monotonously increased in a direction from first portion 71 toward first main surface 1. A width (second width W2) of second portion 72 in contact with buffer layer 49 is larger than first width W1.

As shown in FIG. 10, in the cross section perpendicular to second main surface 2 and parallel to the direction from first region 41 toward second region 42, a width of fourth portion 74 is smaller than a width of third portion 73 (third width W3). The width of fourth portion 74 may be monotonously decreased in a direction from third portion 73 toward first main surface 1. A width (fourth width W4) of fourth portion 74 in contact with buffer layer 49 is smaller than third width W3.

As shown in FIG. 10, a total value of the width (first width W1) of first portion 71 and the width (third width W3) of third portion 73 is 0.5 μm or more and 4 μm or less, for example. The total value of the width (first width W1) of first portion 71 and the width (third width W3) of third portion 73 is a pitch P of each of first super junction layer 10 and second super junction layer 20. The height (third height) of each of first region 41 and second region 42 is 2 m or more, for example.

As shown in FIG. 10, in the cross section perpendicular to second main surface 2 and parallel to the direction from first region 41 toward second region 42, the width (first width W1) of first portion 71 may be smaller than a height (first height T1) of first portion 71. The height (first height T1) of first portion 71 may be larger than a height (second height T2) of second portion 72.

As shown in FIG. 10, in the cross section perpendicular to second main surface 2 and parallel to the direction from first region 41 toward second region 42, the width (third width W3) of third portion 73 may be smaller than the height (first height T1) of third portion 73. The height (first height T1) of third portion 73 may be larger than a height (second height T2) of fourth portion 74.

Next, a method of forming each of the super junction layers will be described.

First, buffer layer 49 is formed on substrate 90. Buffer layer 49 is formed by epitaxial growth, for example. Next, first region 41 and third region 43 are formed on buffer layer 49. First region 41 and third region 43 are formed by epitaxial growth, for example. Each of buffer layer 49, first region 41, and third region 43 has the n type conductivity (first conductivity type). The impurity concentration of buffer layer 49 may be the same as the impurity concentration of each of first region 41 and third region 43, or may be lower than the impurity concentration of each of first region 41 and third region 43. Next, a mask layer (not shown) is formed on first region 41 and third region 43.

Next, a channeling ion implantation step is performed. Specifically, in the state in which the mask layer is disposed on first region 41 and third region 43, impurity ions that can provide the p type conductivity (second conductivity type) such as aluminum are implanted into first region 41 and third region 43. An implantation energy is, for example, 960 keV. An implantation temperature is, for example, a room temperature. Thus, second regions 42 are formed in portions of first region 41. Second regions 42 are provided to be separated from each other in first direction 101. Similarly, fourth regions 44 are formed in portions of third region 43. Fourth regions 44 are provided to be separated from each other in first direction 101. Thus, first super junction layer 10 in which first regions 41 and second regions 42 are alternately arranged is formed and second super junction layer 20 in which third regions 43 and fourth regions 44 are alternately arranged is formed (see FIG. 10).

In the channeling ion implantation step, the impurity ions are implanted in a direction substantially parallel to the <0001> direction, which corresponds to a crystal axis of silicon carbide. The impurity ion implantation direction may be inclined by an angle of 0.5° or less with respect to the <0001> direction, for example. Specifically, the impurity ion implantation direction may be a direction obtained by inclining third direction 103 in an off direction. The off direction may be, for example, first direction 101 or second direction 102. Thus, scattering of the impurity ions and the silicon carbide can be reduced, with the result that the impurity ions can be implanted deeply. As a result, second regions 42 and fourth regions 44 are formed (see FIG. 10). Each of second regions 42 and fourth regions 44 has third portion 73 and fourth portion 74. Fourth portion 74 is formed to have a width smaller than the width of third portion 73.

Next, the following describes a method of measuring the concentration of the p type impurity and the concentration of the n type impurity in the respective impurity regions.

The concentration of the p type impurity and the concentration of the n type impurity in the respective impurity regions can be measured using SIMS (Secondary Ion Mass Spectrometry). A measuring device is, for example, a secondary ion mass spectrometer provided by Cameca. A measurement pitch is, for example, 0.01 μm. When the n type impurity to be detected is nitrogen, a primary ion beam is cesium (Cs). A primary ion energy is 14.5 keV. A secondary ion polarity is negative. When the p type impurity to be detected is aluminum or boron, the primary ion beam is oxygen (02). The primary ion energy is 8 keV. The secondary ion polarity is positive.

Next, the following describes a method of distinguishing the p type region and the n type region from each other.

In the method of distinguishing the p type region and the n type region from each other, SCM (Scanning Capacitance Microscope) is used. A measuring device is, for example, NanoScope IV provided by Bruker AXS. The SCM is a method of visualizing a carrier concentration distribution in a semiconductor. Specifically, a metal-coated silicon probe is used to scan a surface of a sample. On this occasion, a high-frequency voltage is applied to the sample. Majority carriers are excited, thereby applying modulation to a capacitance of the system. The frequency of the high-frequency voltage applied to the sample is 100 kHz, and the voltage is 4.0 V. For the method of distinguishing the p type region and the n type region from each other, SNDM (Scanning Nonlinear Dielectric Microscopy) or SMM (Scanning Microwave Microscopy) may be used.

Although it has been illustrated that the first conductivity type is the n type conductivity and the second conductivity type is the p type conductivity in the above description, the first conductivity type may be the p type conductivity and the second conductivity type may be the n type conductivity. The impurity concentration of the impurity region having the n type conductivity is the concentration of the n type impurity. The impurity concentration of the impurity region having the p type conductivity is the concentration of the p type impurity.

Next, functions and effects of silicon carbide semiconductor device 100 according to each of the embodiments will be described.

Silicon has a lower dielectric breakdown strength than that of silicon dioxide. Therefore, in the case of a Si-MOSFET, reliability can be improved by designing the MOSFET such that the electric field intensity of peripheral region OR is higher than the electric field intensity of active region IR. On the other hand, silicon carbide has a higher dielectric breakdown strength than that of silicon dioxide. Therefore, in the case of the SiC-MOSFET, when the MOSFET is designed such that the electric field intensity of peripheral region OR is higher than the electric field intensity of active region IR, insulating layer 7 is broken prior to the semiconductor layer, thus making it difficult to sufficiently improve the reliability.

To address this, the present inventors have conceived the following idea of design: the electric field intensity of peripheral region OR is made low to suppress electric field from being concentrated at an interface between the semiconductor layer and insulating layer 7, and the electric field intensity of active region IR is made high to actively cause avalanche in active region IR.

The present inventors have diligently examined a specific structure for realizing the above-described idea of design. As a result, it was found that the reliability of silicon carbide semiconductor device 100 can be improved by providing silicon carbide semiconductor device 100 with the following structure, as compared with a structure in which electric field is concentrated in peripheral region OR.

Specifically, a silicon carbide semiconductor device 100 according to the present disclosure includes a substrate 90, an active region IR, a peripheral region OR, and a first electrode 61. Substrate 90 is composed of a silicon carbide semiconductor having a first conductivity type. Active region IR is provided on a portion of a first main surface 1 of substrate 90. Peripheral region OR is provided on substrate 90 and surrounds active region IR when viewed in a plan view. First electrode 61 is provided on a second main surface 2 of substrate 90 opposite to first main surface 1. Active region IR includes a first super junction layer 10, an element layer 40, and a second electrode 62. First super junction layer 10 is provided above substrate 90 and alternately has a first region 41 having the first conductivity type and a second region 42 having a second conductivity type. Element layer 40 is provided above first super junction layer 10. Second electrode 62 is provided on element layer 40. Peripheral region OR includes a second super junction layer 20, a termination layer 50, and an insulating layer 7. Second super junction layer 20 is provided above substrate 90, and alternately has a third region 43 having the first conductivity type and a fourth region 44 having the second conductivity type. Termination layer 50 is provided on and in contact with second super junction layer 20, and alternately has a fifth region 45 having the second conductivity type and a sixth region 46 having the second conductivity type. Insulating layer 7 is in contact with each of an upper end surface of fifth region 45 and an upper end surface of sixth region 46. Fifth region 45 is provided to correspond to third region 43, and sixth region 46 is provided to correspond to fourth region 44. An impurity concentration of sixth region 46 is larger than an impurity concentration of fifth region 45 and is 68 times or less as large as the impurity concentration of fifth region 45. In this way, reliability of silicon carbide semiconductor device 100 can be improved.

Examples

A breakdown voltage simulation was performed to examine a relation between the impurity concentration of sixth region 46 and the reliability of silicon carbide semiconductor device 100 with respect to the impurity concentration of fifth region 45. First, simulation models (1200V design elements) with different impurity concentrations of super junction layers were prepared. As shown in Table 1, in a first simulation model (conditions 2 to 8), the impurity concentration of the super junction layer (in other words, the impurity concentration of each of third region 43 and fourth region 44; see FIG. 1) was set to $1\times10^{17}$ $cm^{-3}$. In a second simulation model (condition 1), the impurity concentration of the super junction layer was set to $3\times10^{16}$ $cm^{-3}$. The thickness of the super junction layer was 7.5 μm. P type impurities having the same impurity concentration were added to third region 43 and fourth region 44, thereby forming fifth region 45 and sixth region 46.

TABLE 1

| Condition | Impurity Concentration of Super Junction Layer ($cm^{-3}$) | Impurity Concentration of Sixth Region/Impurity Concentration of Fifth Region | Breakdown Voltage (V) |
|---|---|---|---|
| Condition 1 | $3\times10^{16}$ | 1.11 | 1229 |
| Condition 2 | $1\times10^{17}$ | 1.48 | 1191 |
| Condition 3 | $1\times10^{17}$ | 1.58 | 1274 |
| Condition 4 | $1\times10^{17}$ | 2.03 | 1755 |
| Condition 5 | $1\times10^{17}$ | 5.26 | 1434 |
| Condition 6 | $1\times10^{17}$ | 33.3 | 1211 |
| Condition 7 | $1\times10^{17}$ | 49.8 | 1201 |
| Condition 8 | $1\times10^{17}$ | 67.7 | 1198 |

As shown in Table 1, in the first simulation model, a value obtained by dividing the impurity concentration of sixth region 46 by the impurity concentration of fifth region 45 was in a range of 1.48 or more and 67.7 or less. In the second simulation model, the value obtained by dividing the impurity concentration of sixth region 46 by the impurity concentration of fifth region 45 was 1.11.

Figure 11:
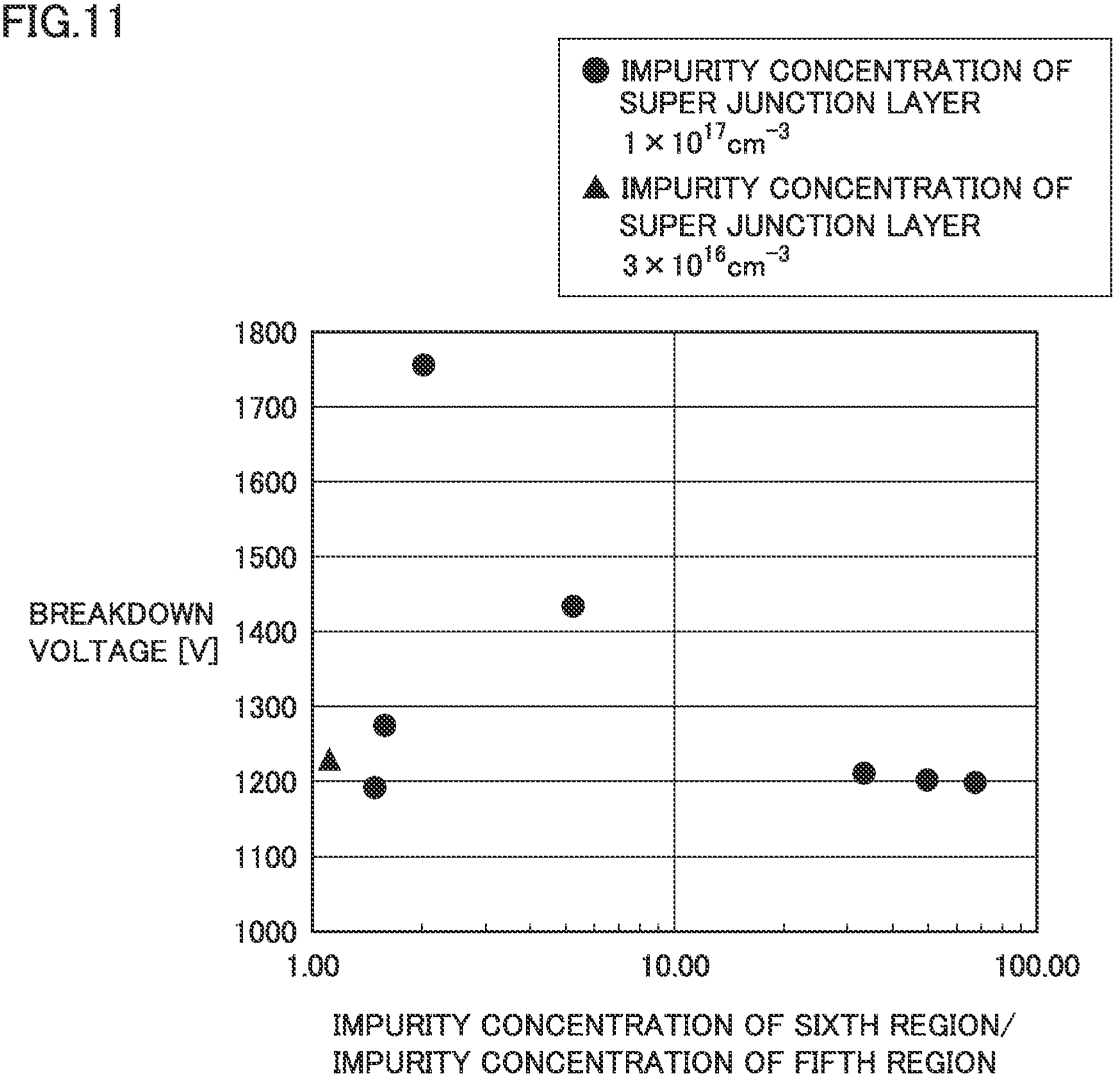
FIG. 11 is a diagram showing a result of a breakdown voltage simulation.

FIG. 11 is a diagram showing a result of the breakdown voltage simulation. As shown in FIG. 11 and Table 1, it was indicated that a high breakdown voltage of about 1.2 kV or more can be achieved in a range in which the impurity concentration of sixth region 46 is 1.11 times or more and 67.7 times or less as large as the impurity concentration of fifth region 45. Particularly, it was indicated that a higher breakdown voltage can be achieved in a range in which the impurity concentration of sixth region 46 is more than 1.48 times and less than 33.3 times as large as the impurity concentration of fifth region 45.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: first main surface; 2: second main surface; 3: third main surface; 3*a*: first upper end surface; 3*b*: second upper end surface; 4: fourth main surface; 5: trench; 6: gate insulating film; 7: insulating layer; 8: side surface; 9: bottom portion; 10: first super junction layer; 11: first substrate portion; 12: first buffer layer; 14: first impurity region; 20: second super junction layer; 23: second impurity region; 24: fourth impurity region; 30: third impurity region; 40: element layer; 41: first region; 42: second region; 43: third region; 44: fourth region; 45: fifth region; 46: sixth region; 47: seventh region; 48: eighth region; 49: buffer layer; 50: termination layer; 51: second substrate portion; 52: second buffer layer; 53: first JTE region; 54: second JTE region; 55: second termination layer; 56: first termination layer; 61: first electrode; 62: second electrode; 63: gate electrode; 64: separation insulating film; 66: channel stopper; 66*a*: first channel stopper region; 66*b*: second channel stopper region; 67: sixth impurity region; 71: first portion; 72: second portion; 73: third portion; 74: fourth portion; 81: first boundary surface; 82: second boundary surface; 90: substrate; 91: first zone; 92: second zone; 93: third zone; 94: fourth zone; 100: silicon carbide semiconductor device; 101: first direction; 102: second direction; 103: third direction; D1: first distance; D2: second distance; 1R: active region; OR: peripheral region; OR1: first peripheral region portion; OR2: second peripheral region portion; OR3: third peripheral region portion; P: pitch; T1: first height; T2: second height; T3: third thickness; T4: fourth thickness; W1: first width; W2: second width; W3: third width; W4: fourth width.

The invention claimed is:

1. A silicon carbide semiconductor device comprising:

a substrate composed of a silicon carbide semiconductor having a first conductivity type;

an active region provided on a portion of a first main surface of the substrate;

a peripheral region provided on the substrate and surrounding the active region when viewed in a plan view; and a first electrode provided on a second main surface of the substrate opposite to the first main surface, wherein the active region includes a first super junction layer that is provided above the substrate and that alternately has a first region having the first conductivity type and a second region having a second conductivity type, an element layer provided above the first super junction layer, and a second electrode provided on the element layer, the peripheral region includes a second super junction layer that is provided above the substrate and that alternately has a third region having the first conductivity type and a fourth region having the second conductivity type, a termination layer that is provided on and in contact with the second super junction layer and that alternately has a fifth region having the second conductivity type and a sixth region having the second conductivity type, and an insulating layer in contact with each of an upper end surface of the fifth region and an upper end surface of the sixth region, the fifth region is provided to correspond to the third region, and the sixth region is provided to correspond to the fourth region, and an impurity concentration of the sixth region is larger than an impurity concentration of the fifth region and is 68 times or less as large as the impurity concentration of the fifth region, the peripheral region includes a channel stopper surrounding the active region when viewed in a plan view, the channel stopper has the first conductivity type, an impurity concentration of the channel stopper is larger than the impurity concentration of each of the first region and the third region, the element layer includes a first impurity region having the first conductivity type, a second impurity region in contact with the first impurity region and having the second conductivity type, and a third impurity region separated from the first impurity region by the second impurity region and having the first conductivity type, each of the fifth region and the sixth region has a thickness smaller than that of the second impurity region, wherein the channel stopper includes a first channel stopper region extending through the first region, the second region, the third region, and the fourth region and a second channel stopper region extending through the third region.

2. The silicon carbide semiconductor device according to claim 1, wherein the impurity concentration of the sixth region is larger than an impurity concentration of the fourth region.

3. The silicon carbide semiconductor device according to claim 1, wherein an absolute value of a difference between the impurity concentration of the fifth region and the impurity concentration of the sixth region is substantially equal to a sum of an impurity concentration of the third region and an impurity concentration of the fourth region.

4. The silicon carbide semiconductor device according to claim 1, wherein a first distance between an upper end surface of the element layer and a boundary surface between the element layer and the first super junction layer is larger than a second distance between an upper end surface of the termination layer and a boundary surface between the termination layer and the second super junction layer.

5. The silicon carbide semiconductor device according to claim 1, wherein each of the first region and the third region has a first portion, and a second portion located between the first portion and the substrate, each of the second region and the fourth region has a third portion in contact with the first portion, and a fourth portion in contact with the second portion and located between the third portion and the substrate, in a cross section perpendicular to the second main surface and parallel to a direction from the first region toward the second region, a width of the second portion is larger than a width of the first portion, a width of the fourth portion is smaller than a width of the third portion, the width of the first portion is smaller than a height of the first portion, and the width of the third portion is smaller than a height of the third portion, and an impurity concentration of each of the first portion and the third portion is larger than an impurity concentration of each of the second portion and the fourth portion.

6. The silicon carbide semiconductor device according to claim 1, wherein an impurity concentration of each of the first region and the third region is $3\times10^{16}$ $cm^{-3}$ or more and $5\times10^{17}$ $cm^{-3}$ or less, and an impurity concentration of each of the second region and the fourth region is $3\times10^{16}$ $cm^{-3}$ or more and $5\times10^{17}$ $cm^{-3}$ or less.

7. The silicon carbide semiconductor device according to claim 1, wherein a first buffer layer having the first conductivity type is provided between the first super junction layer and the substrate, and a second buffer layer having the first conductivity type is provided between the second super junction layer and the substrate.

8. The silicon carbide semiconductor device according to claim 1, wherein the element layer is provided with a trench that has a side surface constituted of each of the first impurity region, the second impurity region, and the third impurity region, and that has a bottom portion contiguous to the side surface and constituted of the first impurity region, the first electrode is a source electrode, and the second electrode is a drain electrode, and a gate electrode is provided inside the trench.

9. The silicon carbide semiconductor device according to claim 1, wherein the first main surface corresponds to a {0001} plane or a plane inclined at an angle of 8° or less with respect to the {0001} plane.

10. The silicon carbide semiconductor device according to claim 1, wherein a pitch of the first super junction layer is substantially the same as a pitch of the second super junction layer.

* * * * *